US009691957B2

(12) United States Patent
Lee et al.

(10) Patent No.: US 9,691,957 B2
(45) Date of Patent: Jun. 27, 2017

(54) LIGHT EMITTING DEVICE PACKAGE

(71) Applicant: SAMSUNG ELECTRONICS CO., LTD., Suwon-si, Gyeonggi-do (KR)

(72) Inventors: Sang-hyun Lee, Suson-si (KR); Dong-hyuck Kam, Hwaseong-si (KR); Gam-han Yong, Suwon-si (KR); Jin-gi Hong, Yongin-si (KR); Seong-deok Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/716,835

(22) Filed: May 19, 2015

(65) Prior Publication Data

US 2015/0255694 A1    Sep. 10, 2015

Related U.S. Application Data

(63) Continuation of application No. 14/172,408, filed on Feb. 4, 2014, now Pat. No. 9,065,033.

(30) Foreign Application Priority Data

Feb. 22, 2013    (KR) ........................ 10-2013-0019376

(51) Int. Cl.
*H01L 33/62* (2010.01)
*H01L 33/60* (2010.01)
*H01L 33/50* (2010.01)
*H01L 33/58* (2010.01)
*H01L 27/15* (2006.01)
(Continued)

(52) U.S. Cl.
CPC ............ *H01L 33/62* (2013.01); *H01L 27/153* (2013.01); *H01L 33/502* (2013.01); *H01L 33/505* (2013.01); *H01L 33/58* (2013.01); *H01L 33/60* (2013.01); *H01L 33/46* (2013.01); *H01L 33/54* (2013.01); *H01L 2224/13* (2013.01); *H01L 2224/45144* (2013.01); *H01L 2224/48091* (2013.01); *H01L 2224/73265* (2013.01);
(Continued)

(58) Field of Classification Search
USPC ...................................... 257/88, 98
See application file for complete search history.

(56) References Cited

U.S. PATENT DOCUMENTS 6,372,608 B1    4/2002  Shimoda et al.
6,645,830 B2    11/2003 Shimoda et al.
(Continued)

FOREIGN PATENT DOCUMENTS

JP    2010-226110 A    10/2010
KR    10-2006-0111305 A    10/2006
(Continued)

*Primary Examiner* — Zandra Smith
*Assistant Examiner* — Lawrence Tynes, Jr.
(74) *Attorney, Agent, or Firm* — Sughrue Mion, PLLC

(57) ABSTRACT

The present application relates to a light emitting device package. The light emitting device package includes a package substrate in which a via hole is formed. An electrode layer extends to both surfaces of the package substrate after passing through the via hole. A light emitting device is arranged on the package substrate and is connected to the electrode layer. A fluorescence film includes a first part that fills at least a part of an internal space of the via hole and a second part that covers at least a part of the light emitting device.

20 Claims, 10 Drawing Sheets

(51) Int. Cl.
*H01L 33/46* (2010.01)
*H01L 33/54* (2010.01)

(52) U.S. Cl.
CPC ............... *H01L 2224/8592* (2013.01); *H01L 2924/0002* (2013.01); *H01L 2924/12044* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2009/0315056 A1* | 12/2009 | Kim | H01L 33/641 257/98 |
| 2010/0032705 A1 | 2/2010 | Shin et al. | |
| 2010/0248400 A1 | 9/2010 | Kim | |
| 2011/0220925 A1 | 9/2011 | Greenwood | |
| 2011/0241040 A1 | 10/2011 | Yu et al. | |
| 2011/0291153 A1 | 12/2011 | Yang et al. | |
| 2012/0003765 A1 | 1/2012 | Wang et al. | |
| 2012/0007132 A1 | 1/2012 | Chang et al. | |
| 2012/0025241 A1 | 2/2012 | Xiao et al. | |
| 2012/0056223 A1 | 3/2012 | Hsieh et al. | |
| 2012/0119228 A1 | 5/2012 | Hsia et al. | |
| 2012/0138988 A1 | 6/2012 | Lee et al. | |
| 2012/0261700 A1* | 10/2012 | Ooyabu | H01L 33/46 257/98 |
| 2013/0099264 A1* | 4/2013 | Zimmerman | H01L 33/64 257/89 |
| 2013/0234184 A1* | 9/2013 | Chen | H01L 33/505 257/98 |

FOREIGN PATENT DOCUMENTS

| | | |
|---|---|---|
| KR | 10-2012-0032899 A | 4/2012 |
| KR | 10-1140607 | 5/2012 |
| KR | 10-1144351 | 5/2012 |

\* cited by examiner

LIGHT EMITTING DEVICE PACKAGE

CROSS-REFERENCE TO RELATED APPLICATIONS

This application is a continuation of U.S. application Ser. No. 14/172,408, filed Feb. 4, 2014, which claims the benefit to Korean Patent Application No. 10-2013-0019376, filed on Feb. 22, 2013, the disclosures of which are incorporated herein in their entirety by reference.

TECHNICAL FIELD

The inventive concept relates to a light emitting device package, and more particularly, to a light emitting device package including a package substrate where a via hole is formed.

BACKGROUND

A light emitting diode (LED) is a semiconductor light emitting device that converts electric signals into light through a PN junction of a compound semiconductor. As the field of use of LEDs is extended to various fields such as interior and exterior lighting, automobile headlights, backlight units (BLUs) of display devices, medical devices, etc., there is a need for an LED package which has a low manufacturing cost per unit, and secures reliability and long-term stability of products.

Recently, in order to enhance a degree of integration of the LED package and reduce a form factor, there have been attempts to electrically and externally connect an LED chip using a vertical electrode formed through a via hole that penetrates a package substrate. However, the via hole that penetrates the package substrate may act as an undesired path for materials used during the LED packaging, and thus, the via hole may become a cause of contamination of an LED package or manufacturing facility.

SUMMARY

The inventive concept provides a light emitting device having a structure that may prevent movement of contaminants through a via hole that penetrates a package substrate.

According to an aspect of the inventive concept, there is provided a light emitting device package. The device package includes a package substrate in which a via hole is formed. An electrode layer extends through the via hole and along both surfaces of the package substrate. A light emitting device is arranged on the package substrate and is connected to the electrode layer. A fluorescence film includes a first part that fills at least a part of an internal space of the via hole and a second part that covers at least a part of the light emitting device.

According to another aspect of the inventive concept, there is provided a light emitting device package. The package includes a package substrate including, a mounting surface, a back surface opposite to the mounting surface, and a first via hole and a second via hole that are respectively limited by a sloped sidewall extended to the back surface from the mounting surface. A first electrode layer extends through the first via hole and along the mounting surface and the back surface. A second electrode layer extends through the second via hole and along the mounting surface and the back surface. A light emitting device is arranged on at least one of the first electrode layer and the second electrode layer on the mounting surface of the package substrate. A fluorescence film includes a first part that fills at least a part of an internal space of the first via hole, a second part that fills at least a part of an internal space of the second via hole, and a third part that covers at least a part of the light emitting device.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
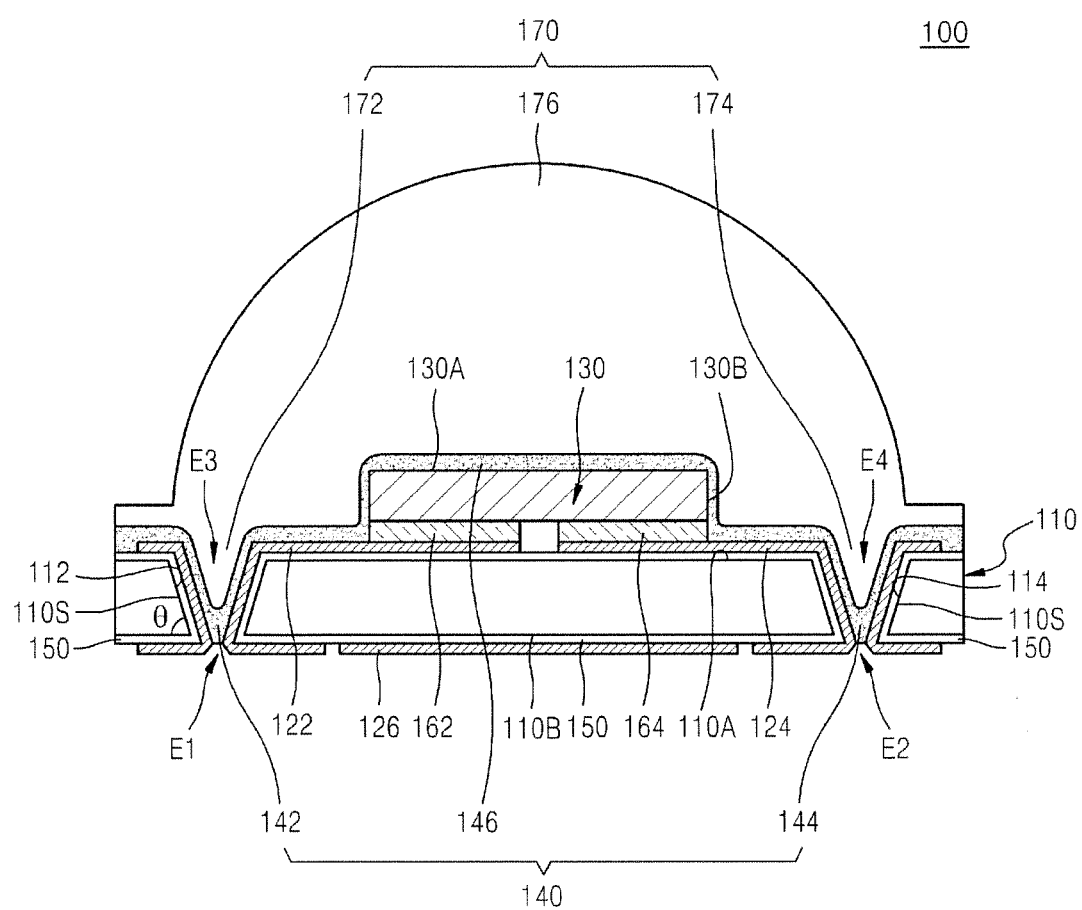
FIG. 1 is a cross-sectional diagram illustrating a configuration of a light emitting device package according to an embodiment of the present application.

In the following detailed description, numerous specific details are set forth by way of embodiments in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

As used herein, the term "and/or" includes any and all combinations of one or more of the associated listed items. Expressions such as "at least one of," when preceding a list of elements, modify the entire list of elements and do not modify the individual elements of the list.

The present application will now be described more fully with reference to the accompanying drawings, in which exemplary embodiments of the application are shown. The application may, however, be embodied in many different forms and should not be construed as being limited to the embodiments set forth herein; rather, these embodiments are provided so that this disclosure will be thorough and complete, and will fully convey the concept of the application to those of ordinary skill in the art. In the drawings, the thicknesses of layers and regions are exaggerated for clarity. Like reference numerals in the drawings denote like elements, and thus their description will not be repeated.

Terms such as "first" and "second" are used to describe various members, areas, layers and/or components, but it will be obvious that the members, areas, layers and/or components are not limited by the terms. The terms do not mean a certain order or priority, but are used only to distinguish one member, area, region or component from another member, area, region or component. Hence, a first member, area, region or component to be described below may also refer to a second member, area, region or component within the scope of the present application. For example, the first component may be referred to as the second component, and the second component may be referred to as the first component within the scope of the present application.

Unless defined otherwise, all terms used here including technical terms and scientific terms have the same meaning as commonly understood by those of ordinary skill in the art.

When an embodiment may be implemented in a different way, a certain process may be changed. For example, two consecutively described processes may be performed substantially at the same time, or may be performed in an order opposite to the described order.

In the attached drawings, for example, illustrated shapes may be modified according to a manufacturing technology and/or tolerance. Hence, the embodiments of the present application are not limited to certain shapes illustrated in the attached drawings, and may be modified in the manufacturing process.

FIG. 1 is a cross-sectional diagram illustrating a configuration of a light emitting device package 100 according to an embodiment of the present application.

Referring to FIG. 1, the light emitting device package 100 includes a package substrate 110, a first electrode layer 122 and a second electrode layer 124 that are formed on the package substrate 110, and a light emitting device 130 that is arranged on the first electrode 122 and the second electrode 124.

The package substrate 110 includes a mounting surface 110A, a back surface 110B that is the opposite side of the mounting surface 110A, a plurality of sloped sidewalls 110S that extend from the mounting surface 110A to the back surface. The plurality of sloped sidewalls 110S limit a first via hole 112 and a second via hole that penetrate the package substrate 110, and constitute an internal sidewall of the first via hole 112 and the second via hole 114. The first via hole 112 and the second via hole 114 may be used as a path for vertical inter-connection between the light emitting device 130 and an electrode (not shown) formed on a main printed circuit board (PCB) of a light emitting device module.

The plurality of sloped sidewalls 110S are sloped to have a shape converged toward the back surface 110B from each mounting surface 110A. Hence, in the first via hole 112 and the second via hole 114, the entrance located at the mounting surface 110A of the package substrate 110 is smaller than the entrance located at the back surface 110B. In some embodiments, the tilt angle θ of the sloped sidewalls 110S may be between about 45° and about 85°, but the present application is not limited thereto.

An insulated film 150 is formed on the surface of the package substrate 110. In some embodiments, the insulated film 150 may be omitted. In some embodiments, the package substrate may be formed of silicon, ceramic or plastic. For example, when the package substrate 110 is formed of silicon, the insulated film 150 may be formed of a silicon oxide film. When the package substrate 110 is formed of ceramic or plastic, the insulated film 150 may be omitted.

The first electrode layer 122 passes through the first via hole 112 on the package substrate 110 and is extended to the mounting surface 110A and the back surface 110B. The second electrode layer 124 passes through the second via hole 114 on the package substrate and is extended to the mounting surface 110A and the back surface 110B. A part of the back surface 110B of the package substrate 110 is covered by a conductive layer 126 which is separated from the first electrode layer 122 and the second electrode layer 124. The conductive layer 126 may discharge heat that is generated from the light emitting device and is transmitted to the package substrate 110. In some embodiments, the first electrode layer 122, the second electrode layer 124 and the conductive layer 126 may be formed of the same material. For example, the first electrode layer 122, the second electrode layer 124 and the conductive layer 126 may be respectively formed of Cu, Au, Ag, Ni, W, Cr or a combination thereof.

The light emitting device may be formed of a light emitting diode (LED). The LED chip may emit blue, green and red light, etc., depending on the type of a compound semiconductor that constitutes the LED chip. Also, the LED chip may emit ultraviolet rays. In certain embodiments, the light emitting device 130 may be formed of an ultraviolet (UV) diode chip, a laser diode chip or an organic light emitting diode (OLED) chip. However, the light emitting device 130 is not limited to the embodiments described above, and may be formed of various optical devices.

The light emitting device 130 may have a horizontal structure including an anode electrode and a cathode electrode that are formed toward the same direction. The anode electrode and the cathode electrode may be arranged toward the package substrate 110. In order to electrically connect the light emitting device 130 to the first electrode layer 122 and the second electrode layer 124, respectively, a first conductive junction layer 162 is interposed between one of the cathode electrode and the anode electrode of the light emitting device 130, and the first electrode layer 122. Furthermore, a second conductive junction layer 164 is interposed between the other of the cathode electrode and the anode electrode of the light emitting device 130, and the second electrode layer 124.

The first conductive junction layer 162 and the second conductive junction layer 164 have a superior electric conductivity, and may contain junction-possible metal materials. In some embodiments, the first conductive junction layer 162 and the second conductive junction layer 164 may be respectively formed of Au, Sn, Pb, Ag, In, Ge, Si or a combination thereof. For example, the first conductive junction layer 162 and the second conductive junction layer 164 may be formed of an Au—Sn alloy, a Pb—Ag—In alloy, a Pb—Ag—Sn alloy, a Pb—Sn alloy, an Au—Ge alloy, an Au—Si alloy or Au. The first conductive junction layer 162 and the second conductive junction layer 164 may be formed by using an eutectic die attach process.

In order to electrically connect the first electrode layer 122 and the second electrode layer 124 to the light emitting device 130, the structure constituting the first conductive junction layer 162 and the second conductive junction layer 164 as described above is used, but the present application is not limited thereto. For example, the light emitting device 130 may have a vertical structure including a cathode electrode and an anode electrode which are directed toward an opposite direction to each other, and in order to electrically connect the first electrode layer 122 and the second electrode layer 124 to two electrodes of the light emitting device 130, a conductive junction layer, a conductive wire, a solder bump, or a combination thereof, which are different from the first conductive junction layer 162 and the second conductive junction layer 164, may be used.

The light emitting device 130 is extended from the upper part of the first electrode layer 122 to the upper part of the second electrode layer 124 so that the light emitting device 130 overlaps with the first electrode layer 122 and the second electrode layer 124, respectively, on the mounting surface 110A of the package substrate 110. Furthermore, the light emitting device 130 is arranged at a location which is spaced apart from the first via hole 112 and the second via hole 114 by a predetermined distance in a horizontal direction, i.e., in a direction extended from the main surface of the package substrate 110, on the mounting surface 110A. Hence, the first via hole 112 and the second via hole 114 are located at both sides of the light emitting device 130 in a location that does not overlap with the light emitting device 130. Although not illustrated, in another embodiment, one of the first via hole 112 and the second via hole 114 may be located at a position that overlaps with the light emitting device 130.

The light emitting device 130 is covered with a fluorescence film 40. The fluorescence film 140 includes a first filling part 142 and a second filling part 144 for filling at least a part of an internal space of each of the first via hole 112 and the second via hole 114, and a device cover part 146 that covers at least a part of the light emitting device 130. The device cover part 146 may cover the light emitting surface of the light emitting device 130. FIG. 1 illustrates that the device cover part 146 of the fluorescence film 140 covers the upper surface 130A and the side surface 130B of the light emitting device 130 in the light emitting device package 100, but the technical concept of the present application is not limited thereto.

The first filling part 142, the second filling part 144 and the device cover part 146 of the fluorescence film 140 are integrally connected. However, the technical concept of the present application is not limited thereto. In another embodiment, the first filling part 142, the second filling part 144 and the device cover part 146 of the fluorescence film 140 may be intermittently connected. For example, at least a part of the side surface 130B of the light emitting device 130 may not be covered by the fluorescence film 140.

In another embodiment, the fluorescence film 140 is formed of a phosphor and a polymer resin. The content of the polymer resin in the fluorescence film 140 may be higher than the content of the phosphor. For example, the fluorescence film 140 may contain a phosphor of about 30 to 45 volume % and a polymer resin of about 55 to 70 volume %, but the present application is not limited thereto.

In another embodiment, the fluorescence film 140 may be formed of a phosphor, filler elements, and a polymer resin. The content of the polymer resin may be higher than the content of the phosphor within the fluorescence film 140. Furthermore, the content of the filler elements may be lower than the content of the phosphor. For example, the fluorescence film 140 may contain a phosphor of about 30 to 45 volume %, filler elements about 2 to 20 volume %, and a polymer resin of about 40 to 55 volume %. However, the contents of the phosphor, the filler elements and the polymer resin are not limited thereto.

The phosphor contained in the fluorescence film 140 may include a material that converts a wavelength into any one of yellow, red or green wavelength. The phosphor may be formed of a fluorescent substance that may generate white light by converting light emitted from the light emitting device 130. The type of the phosphor may be determined by the wavelength of light emitted from the light emitting device 130.

The phosphor may be formed of one of yttrium aluminum garnet (YAG) series, terbium aluminum garnet (TAG) series, silicate series, sulfide series, nitride series and fluorescence materials of quantum dots. For example, the phosphor may be formed of $Y_3Al_5O_{12}:Ce^{3+}$ (YAG:Ce), $M_2Si_5N_8:Eu^{2+}$ where $Eu^{2+}$ ion has been used as an activator, MS (M is alkaline-earth metals), $CaAlSiN_3:Eu^{3+}$, $(Sr,Ca)AlSiN_3:Eu$, $Ca_3(Sc,Mg)_2Si_3O_{12}:Ce$, or $CaSc_2Si_3O_{12}:Ce$, $CaSc_2O_4:Ce$.

The fluorescent materials of quantum dots may be formed of CdSe, CdTe, ZnSe, CdSe, InGaP, or InP elements, etc. The phosphor may have a particle size of about 5 to 90 μm.

When the filler elements are included in the fluorescence film 140, the filler elements may have a particle size of about 5 to 90 μm. As the filler elements are included in the fluorescence film 140, the entrance at the back surface 110B of the first via hole 112 and the second via hole 114 may be easily blocked by the first filling part 142 and the second filling part 144. The filler elements may be formed of $TiO_2$, $SiO_2$, $Al_2O_3$, AlN, and a combination thereof.

The polymer resin included in the fluorescence film 140 may be formed of a transparent resin. For example, the polymer resin included in the fluorescence film 140 may be formed of an epoxy resin, a silicon resin, a polymethyl methacrylate (PMMA), a polystyrene, a polyurethane, or a benzoguanamine resin.

The fluorescence film 140 may be formed with a spray coating process that sprays a phosphor mixture including a resin, a phosphor, filler elements and a solvent, and and followed by a hardening process. In the spray coating process for forming the fluorescence film 140, the phosphor mixture is sprayed on the inside of the first via hole 112, the second via hole 114 and the mounting film 110A. The phosphor mixture is coated on the first electrode layer 122 and the second electrode layer 124 within the first via hole 112 and the second via hole 114. At this time, the phosphor elements included in the fluorescence mixture may be accumulated around the entrance of the back surface 110B within the first via hole 112 and the second via hole 114 so that the entrance at the back surface 110B of the first via hole 112 and the second via hole 114 may be easily blocked.

The insulated film 150, the first electrode layer 122 and the first filling part 142 of the fluorescence film 140 are filled in the stated order on the sloped sidewalls 110S of the package substrate 110 at the inside of the first via hole 112. The insulated film 150, the second electrode layer 124 and the second filling part 144 of the fluorescence film 140 are filled in the stated order on the sloped sidewalls 110S of the package substrate 110 at the inside of the second via hole 114.

The first filling part 142 and the second filling part 144 of the fluorescence film 140 block the entrances E1 and E2 at the back surface 11B, which are respectively limited by the first electrode layer 122 and the second electrode layer 124 at the portion adjacent to the entrance of the back surface 110B of the package substrate 110 at the inside of the first via hole 112 and the second via hole 114. The first filling part 142 and the second filling part 144 of the fluorescence film 140 may fill only a part of the entrances E3 and E4 of the mounting surface 110A which are respectively limited by the first electrode layer 122 and the second electrode layer 124 at the portion adjacent to the entrance of the mounting surface 110A of the package substrate 110 at the inside of the first via hole 112 and the second via hole 114. As a result, the first filling part 142 and the second filling part 144 of the fluorescence film 140 may respectively have the recessed upper surface. Although not illustrated, in some embodiments, the first filling part 142 and the second filling part 144 of the fluorescence film 140 may completely fill the entrances E3 and E4 at the mounting surface 110A of the package substrate at the inside of the first via hole 112 and the second via hole 114.

The entrances E1 and E2 at the back surface 110B of the first via hole 112 and the second via hole 114 are blocked by the first filling part 142 and the second filling part 144, and thus the liquid resin for forming a lens does not leak to the back surface 110B of the package substrate 110 through the first via hole 112 and the second via hole 114 during the process of forming a lens unit 170, as will be described with reference to FIGS. 5G to 5H.

According to the present application, the first filling part 142 and the second filling part 144 of the fluorescence film 140 may be formed simultaneously when the device cover part 146 of the fluorescence film 140 is formed. Hence, a separate process for forming the first filling part 142 and the second filling part 144 is not needed, and the first via hole 112 and the second via hole 114 may be effectively blocked by a simplified process.

The lens unit 170 is formed on the mounting surface 110A of the package substrate 110. The lens unit 170 covers the light emitting device, the first via hole 112, the second via hole 114 and the fluorescence film 140. The lens unit 170 includes a first local protrusion part protruded to the inside of the first via hole 112, a second local protrusion part protruded to the inside of the second via hole 114, and a convex lens unit 176 for controlling luminous intensity distribution of light from the light emitting device 130. The first local protrusion part 172 covers the first filling part 142 of the fluorescence film 140 within the first via hole 112. The second local protrusion part 174 covers the second filling part 144 of the fluorescence film 140 within the second via hole 114. The upper part of the convex lens unit 176 of the lens unit 170 is illustrated to have a dome shape, but the present application is not limited thereto. For example, the lens unit 170 may have various outlines such as a concave shape, a concavo-convex shape, etc. according to the path of light.

The lens unit 170 is formed of light-transmitting materials. In some embodiments, the lens unit 170 may be formed of a silicon resin, an epoxy resin, a urethane resin, an oxetane resin, an acryl resin, a fluorine resin, polycarbonate, polyimide, glass, silica gel, or a combination thereof.

The lens unit 170 may be formed through compression molding, injection molding, or transfer molding, but the present application is not limited thereto. In some embodiments, the lens unit 170 may be formed by applying a liquid resin for forming the lens on the light emitting device 130 through a spray gun. In other embodiments, a molded lens (not shown) may be formed on the light emitting device 130, and the lens unit 170 may be formed by injecting a liquid resin for forming the lens within the space limited by the molded lens.

In the case where the inside of the first via hole 112 and the second via hole 114 is not blocked by the first filling part 142 and the second filling part 144 of the fluorescence film 140, when a liquid resin for forming the lens is applied for molding on the mounting surface 110A of the package substrate 110 to form the lens unit 170, the resin for lens may leak to the back surface 110B of the package substrate 110 through the first via hole 112 and the second via hole 114. As a result, the lower part of the back surface 110B of the package substrate 110, and the molding equipment for forming a lens may become contaminated. However, according to the light emitting device package 100 of the present application, the inside of each of the first via hole 112 and the second via hole 114 is blocked by the first filling part 142 and the second via hole 114 of the fluorescence film 140. Hence, when the liquid resin for the lens is applied on the mounting surface 110A of the package substrate 110 for molding, even if the resin for forming the lens flows into the first via hole 112 and the second via hole 114, the flowing path to the back surface 110B of the package substrate 110 is blocked by the first filling part 142 and the second filling part 144 of the fluorescence film 140, and thus the resin does not leak to the back surface 110B of the package substrate 110.

Figure 2:
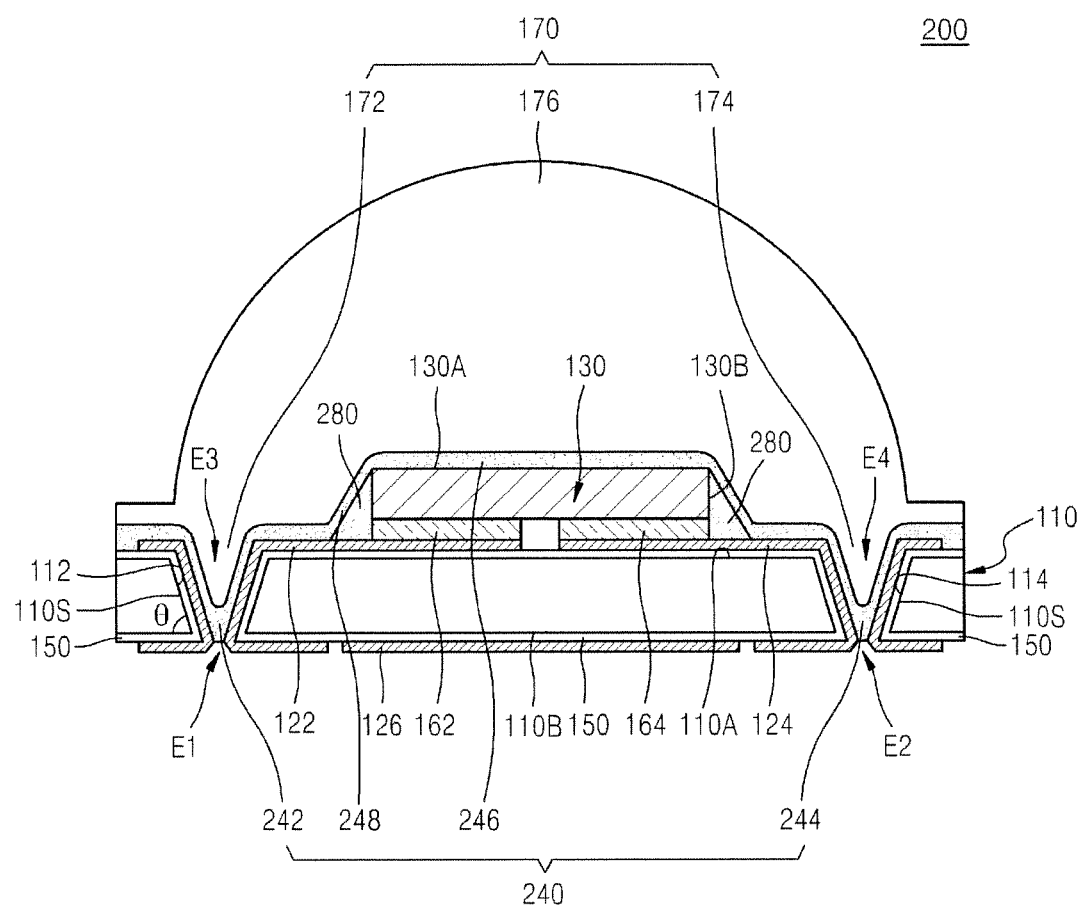
FIG. 2 is a cross-sectional diagram illustrating a configuration of a light emitting device package according to another embodiment of the present application.

FIG. 2 is a diagram illustrating a configuration of a light emitting device package 200 according to another embodiment of the present application. In FIG. 2, the same reference numerals as those used in FIG. 1 denote the same elements, and thus their description will be omitted.

Referring to FIG. 2, a light emitting device package 200 has the same configuration as that of the light emitting device package 110 illustrated in FIG. 1. However, the light emitting device package 200 further includes a reflective film 280 that covers the side surface 130B of the light emitting device 130 in an area between the light emitting device 130 and a fluorescence film 240.

The details about the fluorescence film 240 are similar to those of the fluorescence film 140 of FIG. 1, except that the fluorescence film 240 includes a first filling part 242 and a second filling part 244 that fill at least a part of an internal space of each of the first via hole 112 and the second via hole 114, a device cover part 246 that covers at least a part of the light emitting device 130, and a reflective cover part 248 that covers the reflective film 280. The first filling part 242, the second filling part 244, the device cover part 246 and the reflective cover part 248 of the fluorescence film 240 are integrally connected. In some embodiments, the fluorescence film 240 may have an intermittently connected shape. For example, the thickness of the reflective film cover part 248 that covers the reflective film 280 may be smaller than the thickness of other parts of the fluorescence film 240. In other embodiments, an opening that exposes the reflective film 280 may be formed at a part that covers the reflective film 280 in the fluorescence film 240.

The reflective film 280 may be formed to cover a part of the first reflective layer 122 and the second reflective layer 124 and the side surface 130B of the light emitting device 130 on the mounting surface 110A of the package substrate 110.

In some embodiments, the reflective film 280 may include a low refractive index resin and a light-reflecting filter distributed within the low refractive index resin. The light toward the reflective film 280 may be reflected by the light-reflecting filler within the reflective film 280. The low refractive index resin may be formed of an epoxy resin. The light-reflecting filler may be formed of a light-reflective oxide such as $TiO_2$ or $SiO_2$. In another embodiment, the reflective film 280 may be formed of only a low reflective index resin. Here, the light from the light emitting device 130 may propagate to the inside of the low reflective index resin or may be reflected in the direction of the light emitting device 130 according to the incidence angle of the light.

Figure 3:
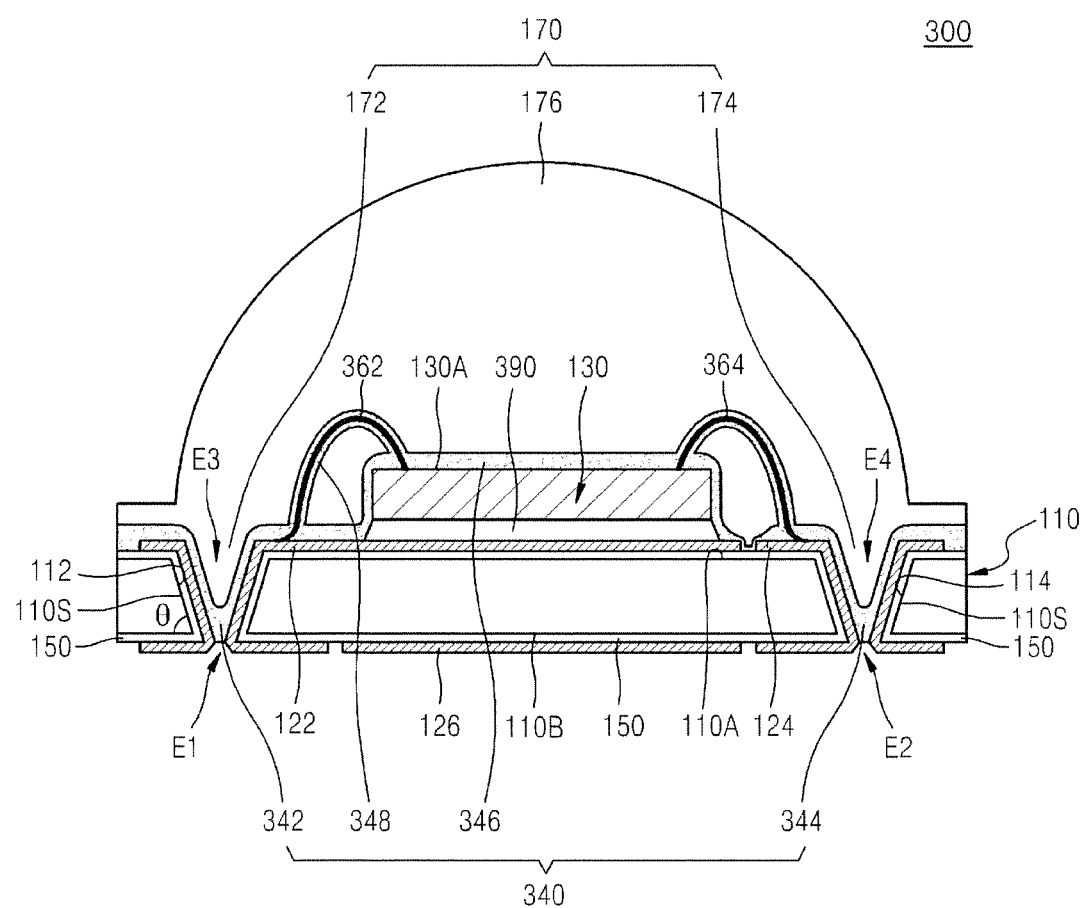
FIG. 3 is a cross-sectional diagram illustrating a configuration of a light emitting device package according to another embodiment of the present application.

FIG. 3 is a cross-sectional diagram illustrating a configuration of a light emitting device package 300 according to another embodiment of the present application. In FIG. 3, the same reference numerals as those used in FIG. 1 denote the same elements, and thus their description will not be repeated here.

Referring to FIG. 3, the light emitting device package 300 has the same configuration as that of the light emitting device package 100 illustrated in FIG. 1. However, a first conductive wire 362 and a second conductive wire 364 for electrically connecting the first electrode layer 122 and the second electrode layer 124, respectively, are provided instead of the first conductive junction layer 162 and the second conductive junction layer 164 of the light emitting device package 300. One of the cathode electrode and the anode electrode of the light emitting device 130, and the first electrode layer 122 may be electrically connected by the first conductive wire 362. Furthermore, the other one of the cathode electrode and the anode electrode of the light emitting device 130 may be electrically connected by the second conductive wire 364.

The first conductive wire 362 and the second conductive wire 364 may be respectively formed of Au, Al, Cu or a combination thereof.

The light emitting device 130 is set on the mounting surface 110A of the package substrate 110 in a die attach process. The light emitting device 130 may be mounted on at least one of the first electrode layer 122 and the second electrode layer 124. FIG. 3 illustrates the light emitting device 130 mounted on the first electrode layer 122, but the present application is not limited thereto. For example, the light emitting device 130 may be mounted on the second electrode layer 124, and may be mounted in such a manner that it overlaps with the first electrode layer 122 and the second electrode layer 124.

The light emitting device 130 may be fixed on the package substrate 110 by a bonding layer 390. The bonding layer 390 may be formed of polymer base die attach adhesives. In another embodiment, the bonding layer 390 may be formed of a polyimide or epoxy resin.

At least a part of each of the first conductive wire 362 and the second conductive wire 364 is covered by a fluorescence film 340. The details of the fluorescence film 340 are similar to those of the fluorescence film 140 of FIG. 1, except that the fluorescence film 340 includes a first filling part 342 and a second filling part 344 that respectively fill at least a part of the internal space of the first via hole 112 and the second via hole 114, a device cover part 346 that covers at least a part of the light emitting device 130, and a wire cover part 348 that covers at least a part of the first conductive wire 362 and the second conductive wire 364. The first filling part 342, the second filling part 344, the device cover part 346 and the wire cover part 348 of the fluorescence film 340 are integrally connected.

Figure 4:
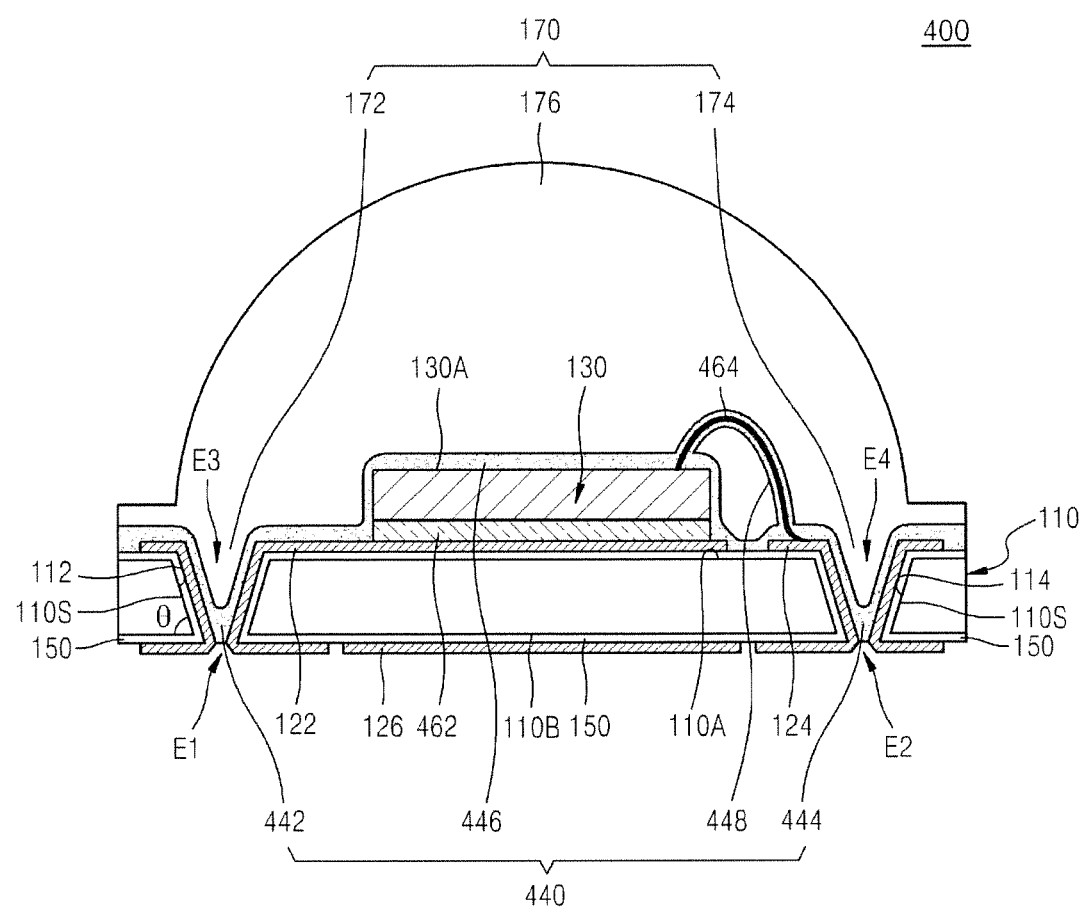
FIG. 4 is a cross-sectional diagram illustrating a configuration of a light emitting device package according to another embodiment of the present application.

FIG. 4 is a cross-sectional diagram illustrating a configuration of a light emitting device package 400 according to another embodiment of the present application. In FIG. 4, the same reference numerals as those used in FIG. 1 denote the same elements, and thus their description will not be repeated here.

Referring to FIG. 4, the light emitting device package 400 generally has the same configuration as that of the light emitting device package 100 illustrated in FIG. 1, except that a conductive junction layer 462 and a conductive wire 464 are provided to electrically connect two electrodes of the light emitting device 130 to the first electrode layer 122 and the second electrode layer 124, respectively. One of the cathode electrode and the anode electrode of the light emitting device 130, and the first electrode layer 122 may be electrically connected by the conductive junction layer 462. In another embodiment, the conductive junction layer 462 may be omitted, and one of the cathode electrode and the anode electrode of the light emitting device 130 may directly contact the first electrode layer 122. The other of the cathode electrode and the anode electrode of the light emitting device 130 may be electrically connected to the second conductive layer 124 by the conductive wire 464.

The conductive junction layer 462 may be formed of Au, Sn, Pb, Ag, In, Ge, Si or a combination thereof. For example, the conductive junction layer 462 may be formed of an Au—Sn alloy, a Pb—Ag—In alloy, a Pb—Ag—Sn alloy, a Pb—Sn alloy, an Au—Ge alloy, an Au—Si alloy or Au. The conductive wire 464 may be formed of Au, al, Cu or a combination thereof.

At least a part of the conductive wire 464 is covered by the fluorescence film 440. The details on the fluorescence film 440 are generally the same as those of the fluorescence film 140 of FIG. 1, except that the fluorescence film 440 includes a first filling part 442 and a second filling part 444 that fill at least a part of the internal space of each of the first via hole 112 and the second via hole 114, a device cover part 446 that covers at least a part of the light emitting device 130, and a wire cover part 448 that covers at least a part of the conductive wire 464. The first filling part 442, the second filling part 444, the device cover part 446, and the wire cover part 448 of the fluorescence film 440 are integrally connected.

FIGS. 5A to 5I are cross-sectional diagrams illustrating a method of manufacturing a light emitting device package according to a process order according to an embodiment of the present application. FIGS. 5A to 5I illustrate a process of manufacturing the light emitting device illustrated in FIG. 2, as an example. In FIGS. 5A to 5I, the same reference numerals as those used in FIGS. 1 and 2 denote the same elements, and thus their description will not be repeated here.

Figure 5A:
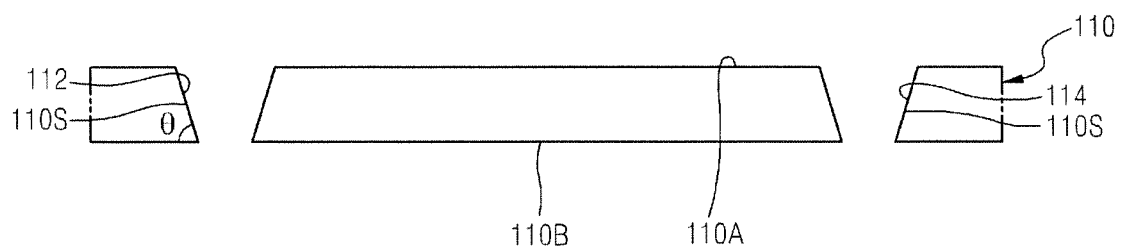
FIGS. 5A to 5I are cross-sectional diagrams illustrating a method of manufacturing a light emitting device package according to a process order according to an embodiment of the present application.

Referring to FIG. 5A, after the package substrate 110 is prepared, a plurality of via holes 112 and 114, which penetrate from the mounting surface 110A of the package substrate 110 to the back surface 110B, are formed.

The plurality of via holes 112 and 114 include the first via hole 112 and the second via hole 114. The internal space of the first via hole 112 and the second via hole 114 is limited by the sloped sidewalls 110S.

In order to form the first via hole 112 and the second via hole 114, one area of the package substrate 110 may be laser-drilled, dry-etched or wet-etched in a direction perpendicular to the direction extended from the main surface of the package substrate 110. The sloped sidewalls 110S may be set to have a shape where the sloped sidewalls 110S converge on the back surface 110B from the mounting surface 110A of the package substrate 110 by adjusting the etching speed and the etching direction while etching the package substrate 110. The slope angle θ of the sloped sidewalls 110S may be between about 45° and about 85°.

Figure 5B:
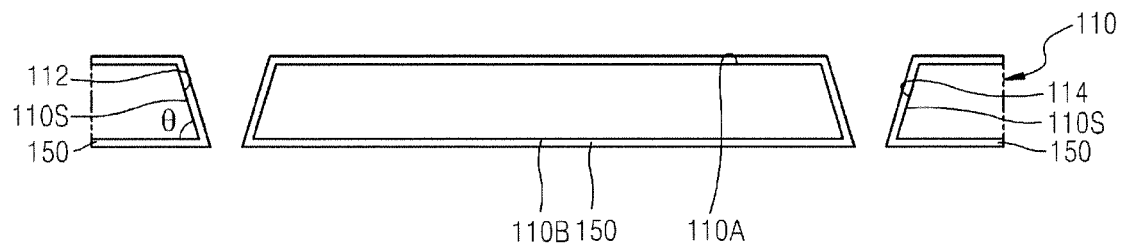

Referring to FIG. 5B, the insulated film 150 is formed on the exposed surface of the package substrate 110. The mounting surface 110A, the back surface 110B and the sloped sidewall 110S of the package substrate 110 may be respectively covered by the insulated film 150.

In another embodiment, in order to form the insulated film 150, a thermal oxidation process, a low pressure chemical vapour deposition (LPCVD) process or a plasma enhanced CVD (PECDV) process may be used. The insulated film 150 may be formed of a silicon oxide, a silicon nitride, a silicon carbide, a diamond-like carbon (DLC), an ultra-nanocrystalline diamond (UNCD) or an aluminum nitride. For example, when the package substrate 110 is formed of silicon, in order to form the insulated film 150, the exposed surface of the package substrate 110 may be oxidized by the thermal oxidation process so as to form the insulated film 150 formed of a silicon oxide film.

In another embodiment, the process of forming the insulated film 150 may be omitted. For example, when the package substrate 110 is formed of ceramic or plastic, the insulated film 150 may be omitted.

Figure 5C:
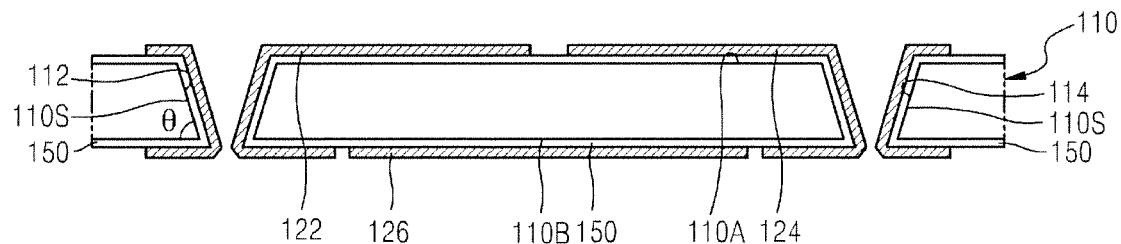

Referring to FIG. 5C, the first electrode layer 122, the second electrode layer 124 and the conductive layer 126 are formed on the package substrate 110.

The first electrode layer 122, the second electrode layer 124 and the conductive layer 126 may respectively use an electric plating process, a screen printing process or a sputtering process. The first electrode layer 122, the second electrode layer 124 and the conductive layer 126 may be formed of the same materials. In another embodiment, in order to form the first electrode layer 122, the second electrode layer 124 and the conductive layer 126, a mask pattern that covers some areas on the package substrate 110 is formed first, then conductive materials for forming the first electrode layer 122, the second electrode layer 124 and the conductive layer 126 are formed on the areas that are not covered by the mask pattern on the package substrate 110, and the mask pattern is removed so that the first electrode layer 122, the second electrode layer 124 and the conductive layer 126 remain.

Figure 5D:
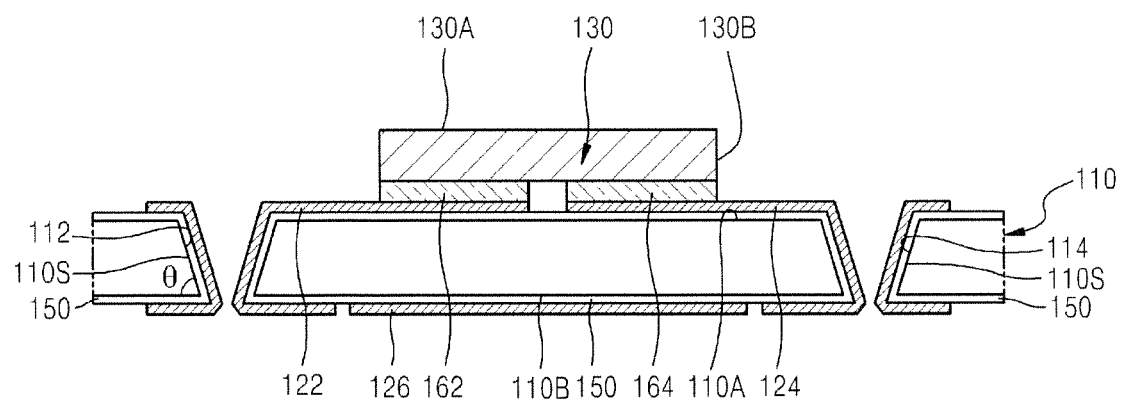

Referring to FIG. 5D, the light emitting device 130 is flip-chip-mounted on the mounting surface 110A of the package substrate 110 through the first conductive substrate layer 162 and the second conductive layer 164 using the eutectic die attach process.

Figure 5E:
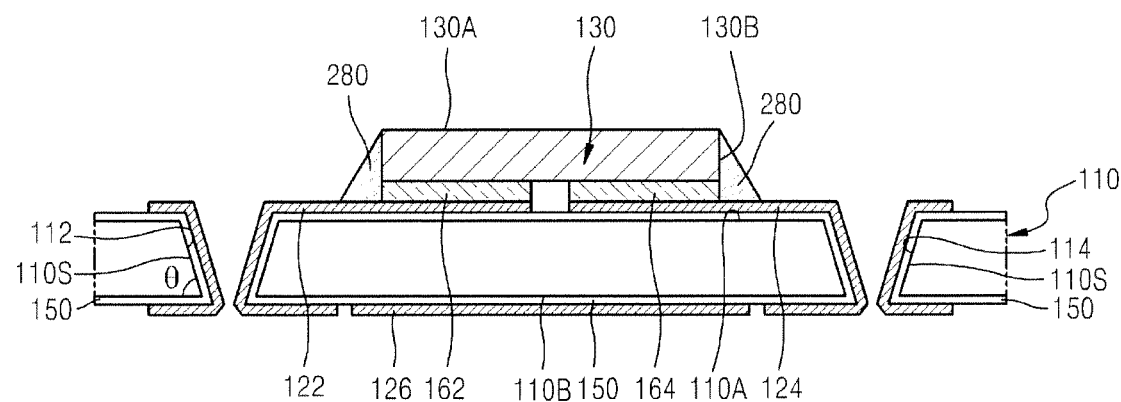

Referring to FIG. 5E, the reflective layer 280 that covers the side surface 130B of the light emitting device 130 is formed on the package substrate 110.

Figure 5F:
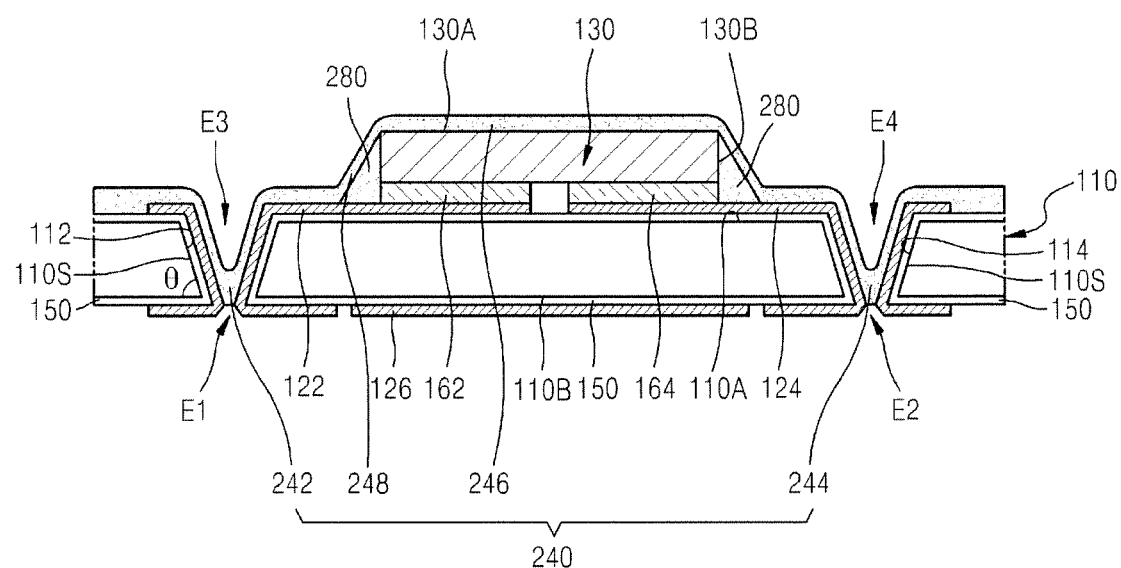

Referring to FIG. 5F, a fluorescence film 240 is formed on the package substrate 110 and the light emitting device 130 using the spray coating process.

The fluorescence film 240 includes the first filling part 242 and the second filling part 244 that fill at least a part of the internal space of each of the first via hole 112 and the second via hole 114, the device cover part 246 that covers at least a part of the light emitting device 130, and a reflective film cover part 248 that covers the reflective film 280. FIG. 5F illustrates that the first filling part 242, the second filling part 244, the device cover part 246, and the reflective film cover part 248 of the fluorescence film 240 are integrally connected, but the present application is not limited thereto. In another embodiment, the fluorescence film 240 includes the first filling part 242, the second filling part 244 and the device cover part 246, but may have a form whereby the fluorescence film 240 includes the first filling part 242, the second filling part 244 and the device cover part 246 that are intermittently connected. In another embodiment, the reflective film cover part 248 of the fluorescence film 240 may not be formed. At least a part of the reflective film 280 may not be covered by the fluorescence film 240.

In order to form the fluorescence film 240, a phosphor mixture may be sprayed on the package substrate 110 and the light emitting device 130. In another embodiment, the phosphor mixture may contain a resin, a phosphor and a solvent. In another embodiment, the phosphor mixture may contain a resin, a phosphor, filler elements and a solvent.

The phosphor mixture may be sprayed on the mounting surface 110 and the inside of each of the first via hole 112 and the second via hole 114 while forming the fluorescence film 240 by using the spray coating process. At the inside of the first via hole 112 and second via hole 114, as the phosphor mixture is coated on the first electrode layer 122 and the second electrode layer 124, the phosphor elements and/or filler elements that constitute the phosphor mixture are accumulated around the entrance of the back surface 110B having a relatively small entrance, and as a result, the entrance of the back surface 110B of the first via hole 112 and the second via hole 114 may be blocked by the phosphor mixture. At this time, the phosphor particles and/or filler particles have a particle size larger than that of the polymer resin, and thus the phosphor particles and/or the filler particles may be accumulated at the inside of the first via hole 112 and the second via hole 114 around the entrance of the back surface 110B of the first via hole 112 and the second via hole 114 so that the first via hole 112 and the second via hole 114 may be easily blocked. The gap between the phosphor particles and/or filler particles may be filled by the polymer resin.

The detailed configuration of the fluorescence film 240 and the phosphor mixture is generally the same as that of the fluorescence film 140 of FIG. 1.

Figure 5G:
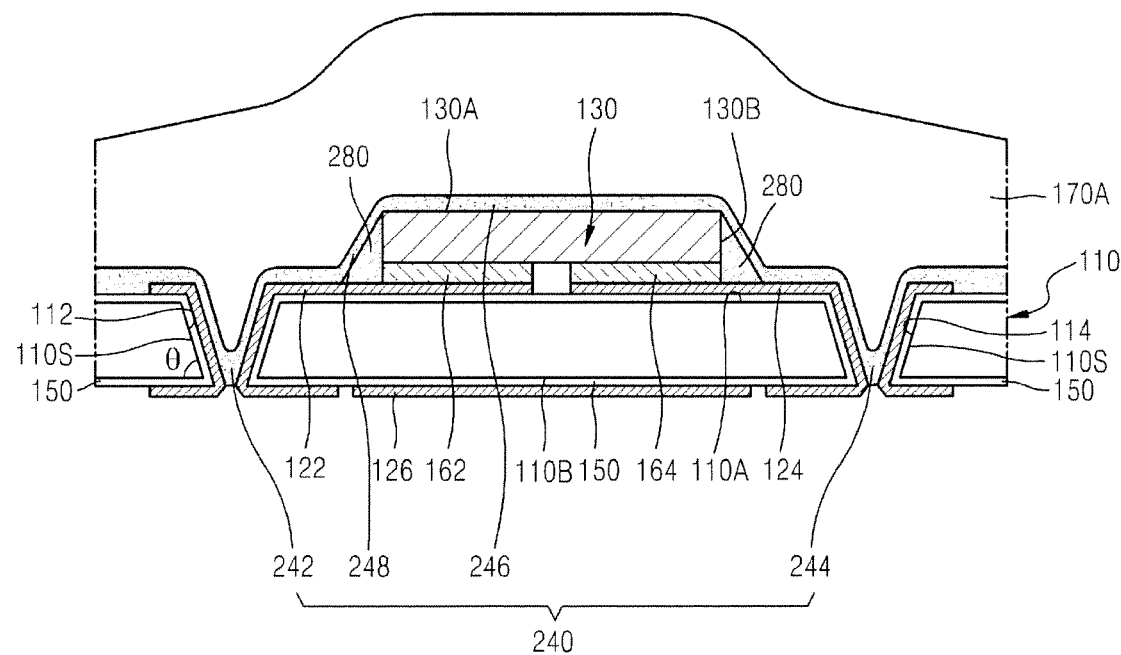

Referring to FIG. 5G, a liquid resin 170A for forming a lens is applied on the package substrate 110 where the fluorescence film 240 is formed.

In another embodiment, the liquid resin 170A for forming the lens may be formed of a silicon resin, an epoxy resin, a urethane resin, an oxetane resin, an acryl resin, a fluorine resin, a polycarbonate, a polyamide, or a combination thereof.

Figure 5H:
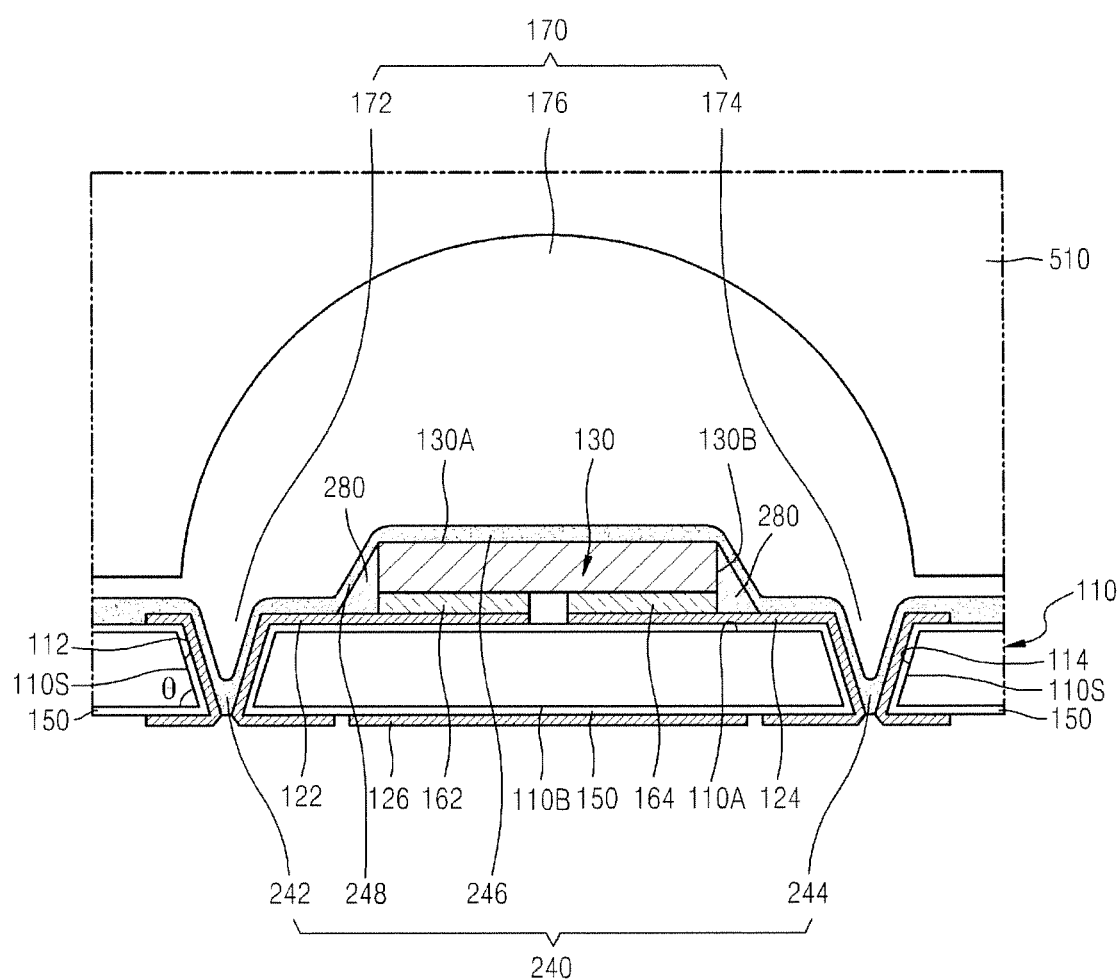

Referring to FIG. 5H, the liquid resin 170A (refer to FIG. 5G) is molded and hardened using the mold 510 on the package substrate 110, and the lens unit 170 is formed on the package substrate 110.

The liquid resin 170A may flow into the first via hole 112 and the second via hole 114 while the liquid resin 170A applies pressure to the mold 510 for the molding of the liquid resin 170A. At this time, the entrance of the back surface 110B of the first via hole 112 and the second via hole 114 is blocked by the fluorescence film 240, and thus even when the liquid resin 170A flows into the first via hole 112 and the second via hole 114, the liquid resin 170A is not leaked to the back surface 110B of the package substrate 110. Hence, the contamination of the lower part of the back surface 110B of the package substrate 110 and the molding equipment for forming a lens may be prevented.

Figure 5I:
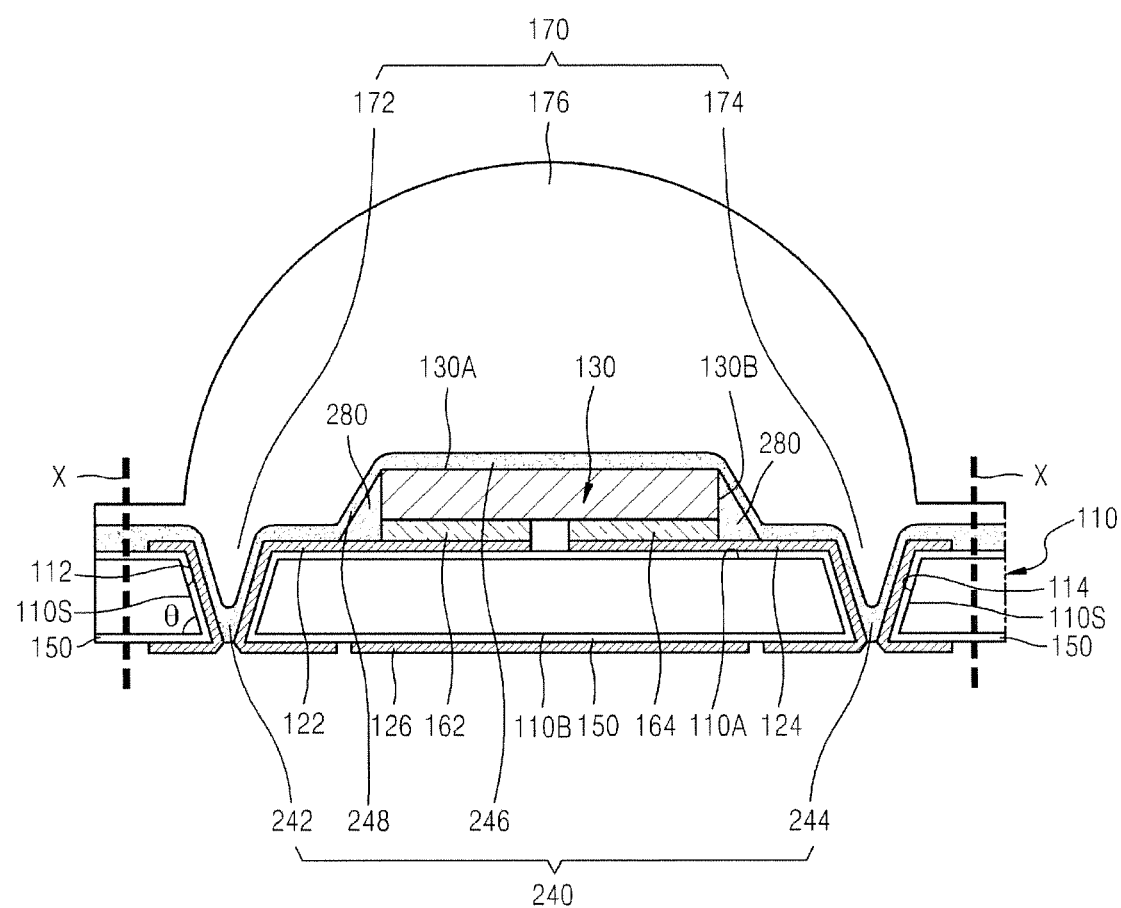

Referring to FIG. 5I, after removing the mold 510, the resulting product where the lens unit 170 is formed is cut along the cross-sectional line X so as to divide the package substrate 110 into a plurality of chips. The plurality of chips may respectively constitute the light emitting device package 200 as illustrated in FIG. 2.

A case where the compression molding process is used to form the lens unit 170 is illustrated in the method of manufacturing the light emitting device package 200 described with reference to FIGS. 5A to 5I. However, the present application is not limited thereto. For example, various molding processes such as injection molding, transfer molding, etc. may be utilized to form the lens unit 170.

The method of manufacturing the light emitting device package 200 illustrated in FIG. 2 has been described with reference to FIGS. 5A to 5I, but the light emitting device packages 100, 300 and 400 illustrated in FIGS. 1, 3 and 4 may be easily formed by those of ordinary skill in the art from the technical concept of the present application described with reference to FIGS. 5A to 5I.

The light emitting device package according to the present application includes a fluorescence film including a filling part that fills at least a part of the internal space of the via hole that penetrates the package substrate. The entrance of the back surface of the package substrate in the via hole is blocked by the filling part of the fluorescence film. Hence, when the liquid resin for forming a lens is molded to form a lens unit on the mounting surface of the package substrate, even if the liquid resin for forming the lens flows into the via hole, the entrance of the via hole adjacent to the back surface of the package substrate is blocked by the filling part of the fluorescence film, and thus the liquid resin for forming the lens does not leak to the back surface of the package substrate. In particular, according to the technical concept of the present application, the filling part of the fluorescence film may be formed simultaneously with the device cover part while forming the device cover part that covers the fluorescence film, and thus a separate process for forming the filling part of the fluorescence film is not needed. Hence, the via hole that penetrates the package substrate may be effectively blocked by a simplified process, and when forming a lens unit, the resin for forming the lens does not leak to the back surface of the package substrate through the via hole that penetrates the package substrate, and the lower part of the back surface of the package substrate and the molding equipment for forming a lens are not contaminated by the resin for forming the lens.

Figure 6:
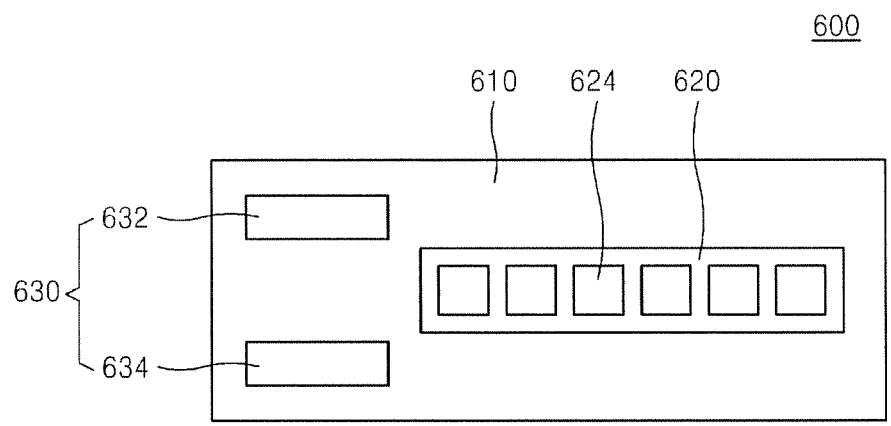
FIG. 6 is a diagram illustrating a dimming system including a light emitting device package according to an embodiment of the present application.

FIG. 6 is a diagram illustrating a dimming system 600 including a light emitting device package according to an embodiment of the present application.

Referring to FIG. 6, the dimming system 600 includes a light emitting module and a power supply 630 which are arranged on a structure 610.

The light emitting module 620 includes a plurality of light emitting device packages 624. The plurality of light emitting device packages 624 include at least one of light emitting device packages 100, 200, 300 and 400 described with reference to FIGS. 1 to 4.

The power supply 630 includes an interface 632 for receiving power, and a power controller 634 for controlling power supplied to the light emitting module 620. The interface 632 may include a fuse that blocks over-current and an electromagnetic wave shield filter that blocks harmful electromagnetic waves. The power controller 634 may include a rectifier that converts an alternating current into a direct current when the alternating current is inputted as power, and a smoothing unit, and a constant voltage controller for conversion into a voltage that is appropriate for the light emitting module 620. The power supply 630 may include a feedback circuit device that compares the light emitting amount at each of the plurality of light emitting device packages 624 with a preset light emitting amount, and a memory device for storing information such as desired brightness and color rendering, etc.

The dimming system 600 may be used as an interior street lamp such as a backlight unit, a lamp and a flat lighting device that are used in a display device such as a liquid crystal display (LCD) apparatus including an image panel, or an exterior lighting device such as a signboard and a signpost. Furthermore, the dimming system 600 may be used in various lighting devices for various vehicles such as in automobiles, ships and airplanes, electronic appliances such as TVs and refrigerators, or medical equipment, etc.

Figure 7:
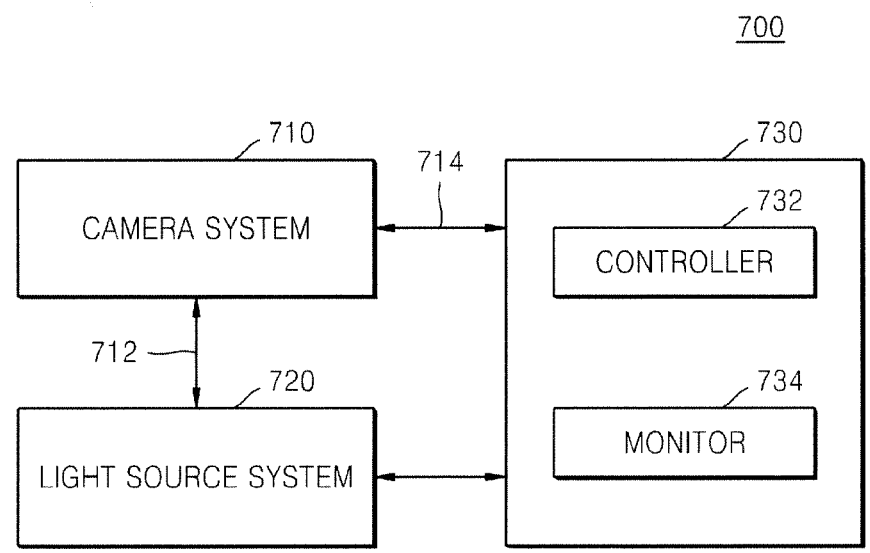
FIG. 7 is a block diagram of an optical processing system including a light emitting device package according to an embodiment of the present application.

FIG. 7 is a block diagram of an optical processing system 700 including a light emitting device package according to an embodiment of the present application.

Referring to FIG. 7, the optical processing system 700 includes a camera system 710, alight source system 720, and a data processing and analysis system 730.

The camera system 710 may be arranged to be directed toward an object for optical processing in astute that directly contacts the object or that is spaced apart from the object by a predetermined distance. In another embodiment, the object for optical processing may be a biological tissue such as the skin or a treatment site. The camera system 710 is connected to the light source system 720 through a light guide 712. The light guide 712 may include an optical fiber light guide for optical transmission, or a liquid light guide.

The light source system 720 supplies light irradiated onto the object for optical processing through the light guide 712. The light source system 720 includes at least one of light emitting device packages 100, 200, 300 and 400 with reference to FIGS. 1 to 4. In another embodiment, ultraviolet rays may be generated in the light source system 720 and the ultraviolet rays may be irradiated onto biological tissues such as the skin or a disease site.

The camera system 710 is connected to the data processing and analysis system 730 through a cable 714. An image signal output from the camera system 710 may be transmitted to the data processing and analysis system 730 through the cable 714. The data processing and analysis system 730 includes a controller 732 and a monitor 734. An image signal transmitted from the camera system 710 may be processed, analyzed and stored in the data processing and analysis system 730.

The optical processing system 700 of FIG. 7 may be applied to various fields such as skin diagnosis, medical treatment equipment, sterilizers, cleaning devices, surgery supplies, cosmetic devices, lighting devices and information-sensing devices.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:
1. A light emitting device package comprising:
a package substrate;
an electrode layer extending along both surfaces of the package substrate;
a light emitting device arranged on the package substrate and connected to the electrode layer; and
a fluorescence film conformably covering a top surface and a side surface of the light emitting device and having a stepped top surface contour corresponding to contours of structures disposed underneath of the fluorescence film, the fluorescence film including:
a first part covering the top surface of the light emitting device and having a first thickness, and
a second part that covering the side surface of the light emitting device and having a second thickness smaller than the first thickness.
2. The light emitting device package of claim 1, wherein the fluorescence film is integrally connected from the first part to the second part.

3. The light emitting device package of claim 1, further comprising:
a reflective film interposed between the side surface of the light emitting device and the second part of the fluorescence film.

4. The light emitting device package of claim 3, wherein the reflective film covers a part of the electrode layer and the side surface of the light emitting device on the package substrate.

5. The light emitting device package of claim 1, wherein the second part of the fluorescence film directly contacts with the side surface of the light emitting device.

6. The light emitting device package of claim 1, further comprising:
a lens unit covering the light emitting device and the fluorescence film.

7. The light emitting device package of claim 1, wherein the fluorescence film includes:
a phosphor of a first volume %,
a polymer resin of a second volume % that is greater than the first volume %, and
filler particles of a third volume % that is smaller than the first volume %.

8. The light emitting device package of claim 7, wherein the filler particles are formed of at least one of $TiO_2$, $SiO_2$, $Al_2O_3$ and AlN.

9. The light emitting device package of claim 1, wherein the fluorescence film further includes a third part covering the electrode layer, the third part of the fluorescence film having a third thickness greater than the second thickness.

10. The light emitting device package of claim 9, wherein the fluorescence film is integrally connected from the first part via the second part to the third part.

11. A light emitting device package comprising:
a package substrate including a mounting surface, a back surface opposite to the mounting surface, and a first via hole and a second via hole;
a first electrode layer extending through the first via hole and along the mounting surface and the back surface;
a second electrode layer extending through the second via hole and along the mounting surface and the back surface;
a light emitting device arranged on at least one of the first electrode layer and the second electrode layer on the mounting surface of the package substrate; and
a fluorescence film conformably covering a top surface and a side surface of the light emitting device and having a. stepped top surface contour corresponding to contours of structures disposed underneath of the fluorescence film the fluorescence film including:
a first part covering the top surface of the light emitting device and having a first thickness, and
a second part that covering the side surface of the light emitting device and having a second thickness smaller than the first thickness.

12. The light emitting device package of claim 11, wherein the light emitting device is arranged at a location that is spaced apart from the first via hole and the second via hole on the mounting surface.

13. The light emitting device package of claim 11, further comprising:
a first conductive junction layer that is formed between the light emitting device and the first electrode layer; and
a second conductive junction layer that is formed between the light emitting device and the second electrode layer.

14. The light emitting device package of claim 11, further comprising:
a conductive wire that is connected between at least one of the first electrode layer and the second electrode layer, and the light emitting device,
wherein the fluorescence film further includes a third part covering at least a part of the conductive wire.

15. The light emitting device package of claim 11, further comprising:
a reflective film formed on the first and second electrode layers and interposed between the side surface of the light emitting device and the second part of the fluorescence film.

16. The light emitting device package of claim 11, wherein the second part of the fluorescence film directly contacts with the side surface of the light emitting device.

17. A light dimming system comprising:
a light emitting module;
a power supply for receiving power and supplying the power to the light emitting module; and
one or more light emitting device packages, each package including:
a package substrate in which a via hole is formed;
an electrode layer extending through the via hole and along both surfaces of the package substrate;
a light emitting device arranged on the package substrate and connected to the electrode layer; and
a fluorescence film conformably covering a top surface and a side surface of the light emitting device and having a stepped top surface contour corresponding to contours of structures disposed underneath of the fluorescence film, the fluorescence film including:
a first part covering the top surface of the light emitting device and having a first thickness, and
a second part that covering the side surface of the light emitting device and having a second thickness smaller than the first thickness.

18. The system of claim 17, wherein the fluorescence film is integrally connected from the first part to the second part.

19. The system of claim 17, further comprising:
a reflective film interposed between the side surface of the light emitting device and the second part of the fluorescence film.

20. The system of claim 17, wherein the fluorescence film includes:
a phosphor of a first volume %,
a polymer resin of a second volume % that is greater than the first volume %, and
filler particles of a third volume % that is smaller than the first volume %.

* * * * *